(12) United States Patent
Chan

(10) Patent No.: US 10,381,294 B2
(45) Date of Patent: Aug. 13, 2019

(54) SEMICONDUCTOR PACKAGE DEVICE

(71) Applicant: Advanced Semiconductor Engineering, Inc., Kaohsiung (TW)

(72) Inventor: Hsun-Wei Chan, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/396,087

(22) Filed: Dec. 30, 2016

(65) Prior Publication Data

US 2017/0221805 A1 Aug. 3, 2017

Related U.S. Application Data

(60) Provisional application No. 62/289,524, filed on Feb. 1, 2016.

(51) Int. Cl.
*H01L 23/495* (2006.01)
*H01L 23/06* (2006.01)
*H01L 25/065* (2006.01)

(52) U.S. Cl.
CPC ........ *H01L 23/49575* (2013.01); *H01L 23/06* (2013.01); *H01L 23/49503* (2013.01);
(Continued)

(58) Field of Classification Search
CPC ........... H01L 23/49575; H01L 25/0655; H01L 23/06; H01L 23/49541; H01L 33/483; H01L 33/62

See application file for complete search history.

(56) References Cited

U.S. PATENT DOCUMENTS

| 5,754,977 A | 5/1998 | Gardner et al. |
| 2008/0012036 A1* | 1/2008 | Loh ............... H01L 33/483 |
| | | 257/99 |

(Continued)

FOREIGN PATENT DOCUMENTS

| CN | 1684278 A | 10/2005 |
| CN | 101916820 A | 12/2010 |

OTHER PUBLICATIONS

Office Action for corresponding Chinese Patent Application No. 201710054477.1, dated Jun. 17, 2019, 7 pages.

(Continued)

*Primary Examiner* — Michele Fan
(74) *Attorney, Agent, or Firm* — Foley & Lardner LLP; Cliff Z. Liu

(57) ABSTRACT

An electronic device comprises a carrier, a leadframe, a package body and a plurality of electronic components. The carrier has an open top surface, a closed bottom surface and sidewalls extending between the closed bottom surface and the open top surface. The carrier has a circular cavity in its open top surface extending toward the closed bottom surface. The carrier includes a leadframe including a die pad and a plurality of leads. The leads are physically isolated from the die pad by at least one gap. The package body partially encapsulates the leadframe such that a portion of an upper surface of the die pad and a portion of each of the leads are exposed from the package body. The exposed portions of the leads are arranged radially along the die pad. The electronic components are disposed on the die pad.

26 Claims, 7 Drawing Sheets

(52) U.S. Cl.
CPC .... *H01L 23/49541* (2013.01); *H01L 25/0655* (2013.01); *H01L 2224/48137* (2013.01); *H01L 2224/48247* (2013.01); *H01L 2224/49171* (2013.01); *H01L 2224/97* (2013.01)

(56) References Cited

U.S. PATENT DOCUMENTS

| | | | | |
|---|---|---|---|---|
| 2012/0074544 | A1* | 3/2012 | Masuda | H01L 21/4832 257/673 |
| 2013/0114241 | A1* | 5/2013 | van de Ven | H05B 33/0863 362/84 |
| 2013/0242524 | A1* | 9/2013 | Chan | H01L 33/486 361/813 |
| 2014/0021493 | A1* | 1/2014 | Andrews | H01L 33/60 257/88 |
| 2016/0013378 | A1* | 1/2016 | Sakamoto | H01L 33/54 257/99 |
| 2016/0286616 | A1* | 9/2016 | van de Ven | H05B 33/0842 |

OTHER PUBLICATIONS

Search Report for corresponding Chinese Patent Application No. 20171005447711.1, dated Jun. 17, 2019. 4 pages.

* cited by examiner

SEMICONDUCTOR PACKAGE DEVICE

CROSS-REFERENCE TO RELATED APPLICATION

This application claims the benefit of and priority to U.S. Provisional Application No. 62/289,524, filed Feb. 1, 2016, the content of which is incorporated herein by reference in its entirety.

BACKGROUND

1. Technical Field

The present disclosure relates to a semiconductor package device, and more particularly, to a semiconductor package device including light emitting components.

2. Description of the Related Art

Light Emitting Diodes (LEDs), or laser diodes, are widely used for many applications. A semiconductor light emitting device can include an LED chip having one or more semiconductor layers. The layers can be configured to emit coherent and/or incoherent light when energized. During manufacture, a large number of LED semiconductor dies can be produced on a semiconductor wafer. The wafer can be probed and tested to accurately identify particular color characteristics of each die, such as color temperature. Then, the wafer can be singulated to cut the wafer into a plurality of chips. The LED chips are typically packaged to provide external electrical connections, heat sinking, lenses or waveguides, environmental protection, and/or other features. Methods for making LED chip packages include processes such as die attach, wire bonding, encapsulating, testing, and others.

Some LED control circuits are used to generate a constant DC current through a string of a given number of LEDs. If it is desired to control each LED individually, a larger circuit board can be used to implement more complex circuits. It is useful in some cases to implement a leadframe with high quantities of leads for electrical connections.

In addition, in some lighting devices, multiple LEDs and a controller can individually molded and then mounted onto a mother board, which increases the manufacturing cost and the total size of the lighting devices.

SUMMARY

In accordance with some embodiments of the present disclosure, an electronic device includes a carrier, a leadframe, a package body and a plurality of electronic components. The carrier has an open top surface, a closed bottom surface and sidewalls extending between the closed bottom surface and the open top surface. The carrier has a circular cavity in its open top surface extending toward the closed bottom surface. The carrier includes a leadframe including a die pad and a plurality of leads. The leads are physically isolated from the die pad by at least one gap. The package body partially encapsulates the leadframe such that a portion of an upper surface of the die pad and a portion of each of the leads are exposed from the package body. The exposed portions of the leads are arranged radially along the die pad. The electronic components are disposed on the die pad.

In accordance with some embodiments of the present disclosure, a carrier includes a leadframe and a package body. The leadframe includes a die pad and a plurality of leads. The leads are physically isolated from the die pad by at least one gap. The package body partially encapsulates the leadframe such that a portion of an upper surface of the die pad and a portion of each of the leads are exposed from the package body. The package body has an open top surface, a closed bottom surface and sidewalls extending between the closed bottom surface and the open top surface. The package body has a circular cavity in its open top surface extending toward the closed bottom surface. The exposed portions of the leads are arranged radially along the die pad.

In accordance with some embodiments of the present disclosure, an electronic module includes a first carrier. The first carrier includes a plurality of packages disposed thereon. Each package includes a second carrier. A case covers the packages. The second carrier has an open top surface, a closed bottom surface and sidewalls extending between the closed bottom surface and the open top surface. The second carrier has a circular cavity in its open top surface extending toward the closed bottom surface. The second carrier includes a leadframe, a package body and a plurality of electronic components. The leadframe includes a die pad and a plurality of leads. The leads are physically isolated from the die pad by at least one gap. The package body partially encapsulates the leadframe such that a portion of an upper surface of the die pad and a portion of each of the leads are exposed from the package body. The exposed portions of the leads are arranged radially along the die pad. The electronic components are disposed on the die pad.

Figure 1A:
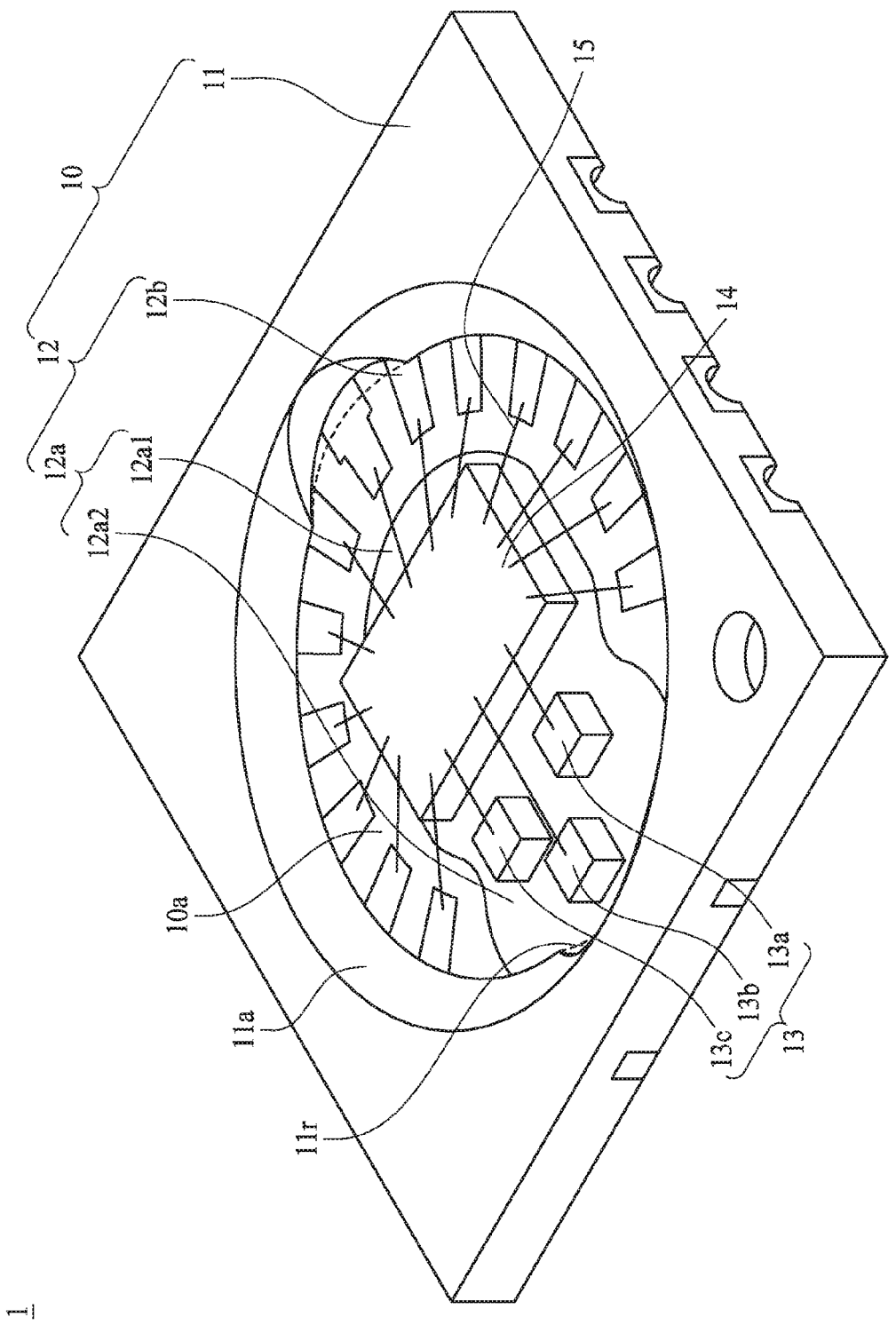
FIG. 1A illustrates a perspective view of a semiconductor package device in accordance with some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

FIG. 1A illustrates a perspective view of a semiconductor package device 1 in accordance with some embodiments of the present disclosure. The semiconductor package device 1 includes a carrier 10 and a plurality of electronic components 13, 14.

The carrier 10 has an open top surface, a closed bottom surface and sidewalls extending between the closed bottom surface and the open top surface. The carrier 10 has, or defines, a circular cavity 10a in its open top surface extending toward the closed bottom surface. As shown in FIG. 1A, the carrier includes a leadframe 12 and a package body 11.

The leadframe 12 is a pre-molded leadframe including a die pad 12a and a plurality of leads 12b. The leadframe 12 can be made of copper, copper alloy or another suitable metal or alloy. In some embodiments, the leadframe 12 may include one of, or a combination of the following: iron/iron alloy, nickel/nickel alloy, or any other metal/metal alloy. In some embodiments, the leadframe 12 is coated with a silver layer.

The die pad 12a has a first area 12a1 and a second area 12a2. In some embodiments, the first area 12a1 of the die pad 12a is in a substantially arched or rounded shape. For example, the first area 12a1 of the die pad 12a may have a circular shape, an oval shape or other arched shape. In some embodiments, the first area 12a1 of the die pad 12a may be in the shape of at least a portion of a circle, oval, or other arched or rounded shape. In some embodiments, the die pad 12a is a thermal pad that is able to withstand the thermal energy generated by the electronic components 13, 14 disposed thereon (e.g. includes a suitable material for withstanding the thermal energy).

The leads 12b are disposed radially along the die pad 12a. For example, the leads 12b may have a direction of longest extension that is in a direction from a center of the die pad 12a towards an outer edge of the die pad 12a. The leads 12b are separated from the die pad 12a. That is, there is a gap between each lead 12b and the die pad 12a. In some embodiments, at least one gap is filled by the package body 11. In some embodiments, distances between the edge of the die pad 12a and the end of at least two leads 12b, some greater number of leads 12b, or each lead 12b are substantially the same. In some embodiments, a width of the gap is in a range from about 0.15 µm to about 0.2 µm. In some embodiments, the end of each lead is conformal with the edge of the die pad 12a. In some embodiments, the leadframe 12 has thirteen leads. Alternatively, the leadframe 12 may have any number of leads, depending on requirements of the semiconductor package device.

The package body 11 is disposed on the leadframe 12 and covers a portion of the leadframe 12. For example, the package body 11 covers a portion of the second area 12a2 of the die pad 12a and a portion of the leads 12b. In some embodiments, the package body 11 includes an epoxy resin having fillers dispersed therein.

The package body 11 has a circular cavity 10a formed in its top surface extending toward its bottom surface, the cavity 10a exposing a portion of the die pad 12a and a portion of the leads 12b. A sidewall 11a of the cavity 10a may be formed of materials which include reflective materials. In some embodiments, the sidewall 11a of the cavity 10a is used as a reflector. Since the electronic component 13 and the electronic component 14 are integrated into a single semiconductor package device 1, it may be desirable to make the semiconductor package device smaller. The shape of the package body 11 can help to reduce the total size of the semiconductor package device 1. For example, the package body 11 may include a recess 11r to accommodate more components or to expose more leads. In some embodiments the recess 11r is formed in the sidewall 11a of the package body 11.

The electronic components 13, including 13a, 13b, 13c, are disposed on the second area 12a2 of the die pad 12a. In some embodiments, the electronic components 13a, 13b, 13c are LEDs. The LEDs 13a, 13b, 13c can be positioned in close proximity to each other. In some embodiments, such as for implementation in an "RGB" device, the three LEDs 13a, 13b, 13c may be a red LED, a green LED and a blue LED respectively (e.g., emitting light respectively in a red frequency spectrum, a green frequency spectrum, and a blue frequency spectrum), and may be positioned in close proximity to each other for improved color mixing.

The electronic component 14 is disposed on the first area 12a1 of the die pad 12a. In some embodiments, the electronic component 14 is a controller. The electronic component 14 can be or can include an integrated circuit (IC). The electronic component 14 may be a general purpose processor, microprocessor, or microcontroller, or another type of programmable component such as a field programmable gate array (FPGA), or other controller such as an application-specific IC (ASIC).

The electronic component 14 is electrically connected to the LEDs 13a, 13b, 13c through conductive wires 15, and is configured to control the LEDs 13a, 13b, 13c through at least the wires. The electronic component 14 is also connected to the leads 12b through other conductive wires 15. In comparison with directly connecting the LEDs 13a, 13b, 13c to the leads 12b, the length of the conductive wires can be reduced by connecting the LEDs 13a, 13b, 13c to the electronic component 14 and then connecting the electronic component 14 to the leads, which can help to prevent a short circuit in the conductive wires 15. In addition, the cost for manufacturing the conductive wires 15 can be reduced because of their shorter length.

In order to individually or collectively control the LEDs, a carrier may include or carry a sophisticated circuitry, which may require a large number of leads for electrical connections. In some embodiments, a carrier may include a square cavity, which can limit a number and layout of the leads and can also hinder bonding of conductive wires between the electronic components and the leads due to different distances between leads and connection pads of the electronic components. FIG. 1A shows a circular cavity 10a, in which the leads 12b are conformal with the edge of the circular die pad 12a, which can help to increase the number of leads that can fit in the semiconductor package device 1. In addition, since the shape and the size of each lead 12b exposed from the package body 11 may be substantially the same, it can be simpler to bond the conductive wires 15 from the electronic component 14 to the leads. Thereby, the manufacturing cost and time can be reduced.

Figure 1B:
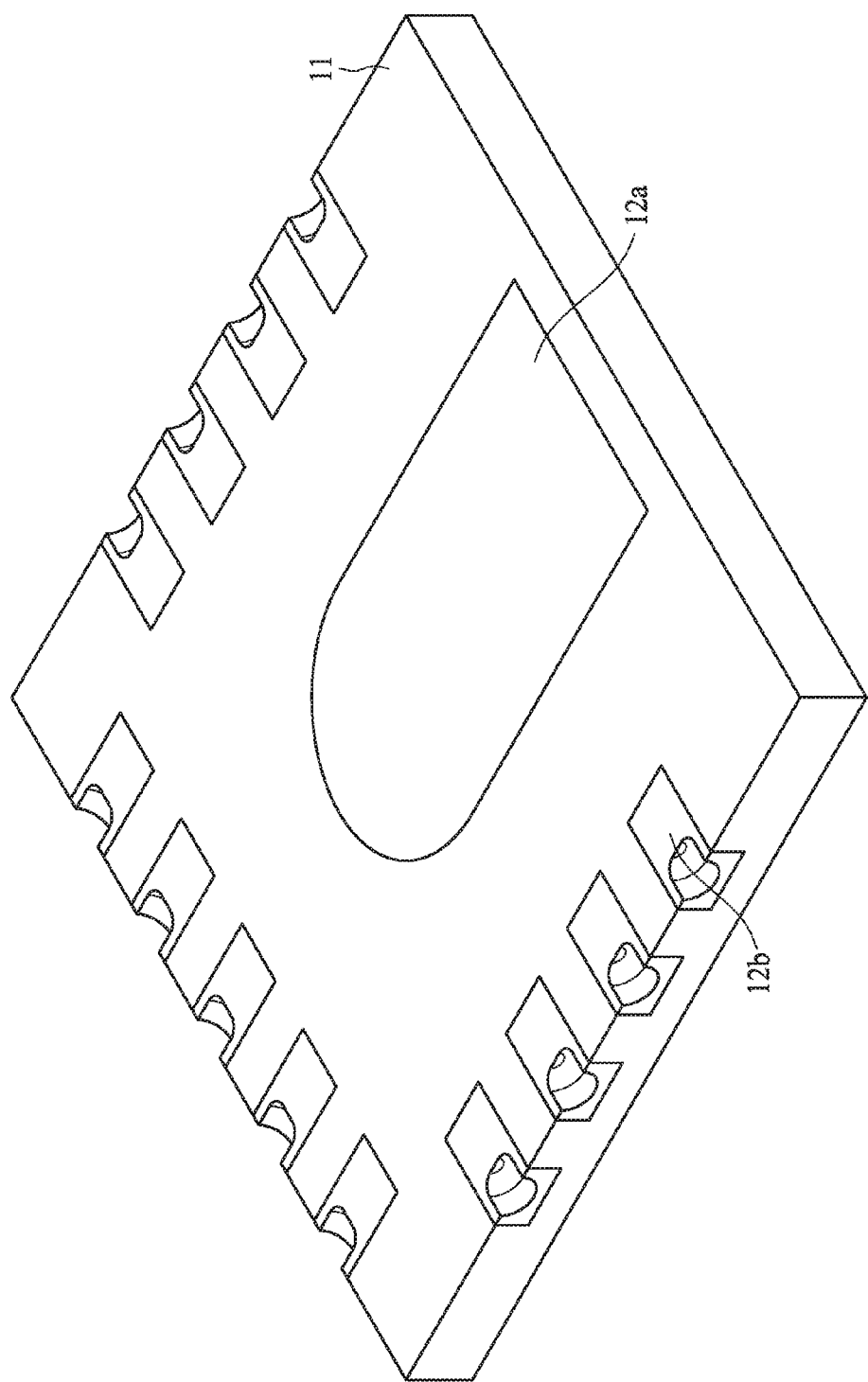
FIG. 1B illustrates a bottom view of a semiconductor package device in accordance with some embodiments of the present disclosure.

FIG. 1B illustrates a bottom view of a semiconductor package device 1 in accordance with some embodiments of the present disclosure. As shown in FIG. 1B, a portion of the die pads 12a and the leads 12b are covered by the package body 11. The exposed portion of the die pads 12a and the leads 12b are substantially coplanar with the bottom surface of the package body 11.

Figure 1C:
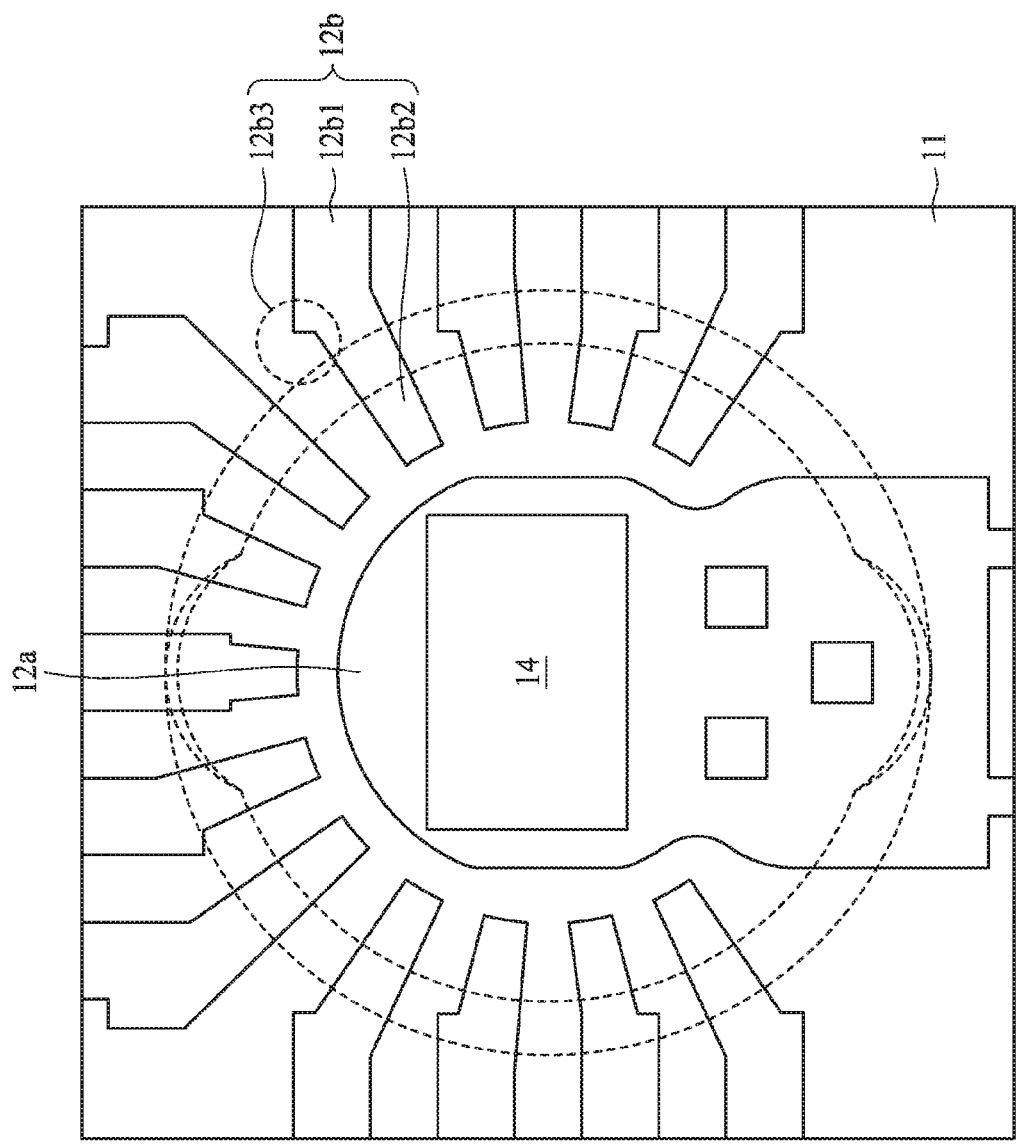
FIG. 1C illustrates a schematic diagram of a semiconductor package device in accordance with some embodiments of the present disclosure.

FIG. 1C illustrates a schematic diagram of a semiconductor package device 1 in accordance with some embodiments of the present disclosure. As shown in FIG. 1C, each lead 12 includes a first portion 12b1 encapsulated or covered by the package body 11 and a second portion 12b2 exposed from the package body 11. The width of each lead 12 decreases in a direction toward the die pad 12a. Although the total lengths of the leads 12 may be different, the lengths of the second portion 12b2 of each lead are substantially identical. In some embodiments in which the lengths of each lead 12 are different, a step 12b3 may be formed between the first portion 12b1 and the second portion 12b2, thus making the lengths of the exposed portion (e.g., the second portion 12b2) of each lead 12 uniform.

Figure 2:
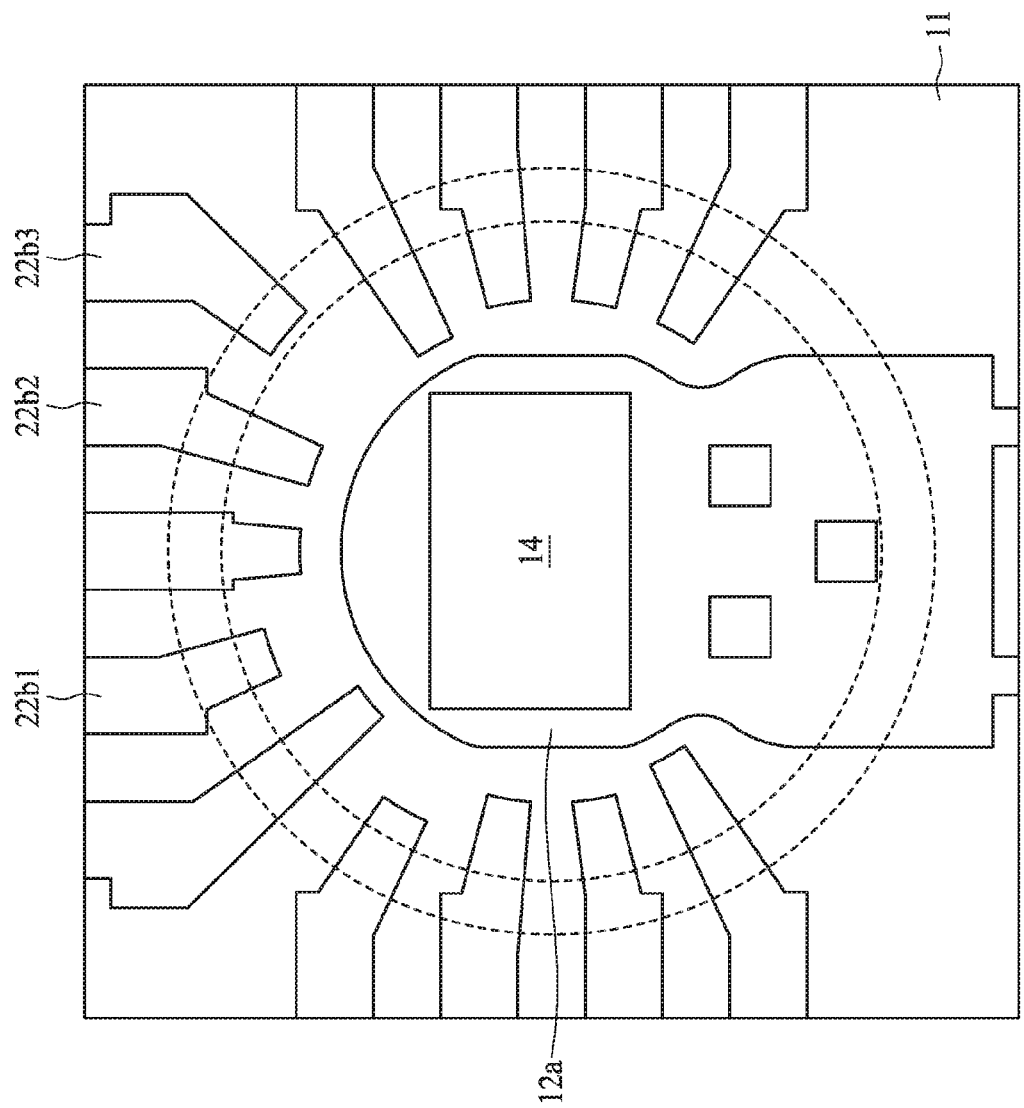
FIG. 2 illustrates a top view of a semiconductor package device in accordance with some embodiments of the present disclosure.

FIG. 2 illustrates a schematic diagram of a semiconductor package device 2 in accordance with some embodiments of the present disclosure. The semiconductor package device 2 is similar to the semiconductor package device 1 shown in FIG. 1C except that lengths of the exposed portion of each lead are not all the same. For example, the length of the exposed portion of the lead 22b1 is less than that of the exposed portion of the lead 22b2. In some embodiments, some leads (e.g., the lead 22b3) might be completely encapsulated or covered by the package body 11. Therefore, the distances between each lead and the die pad 12a are not all uniform, which may increase the difficulty of bonding conductive wires from the electronic component 14 to the leads. This is in contrast to the embodiments shown in FIG. 1C, where, since the shape and the length of each lead 12b exposed from the package body 11 are substantially the same, it is simpler to bond the conductive wires from the electronic component 14 to the leads 12b, which can help to reduce the manufacturing cost and time.

Figure 3:
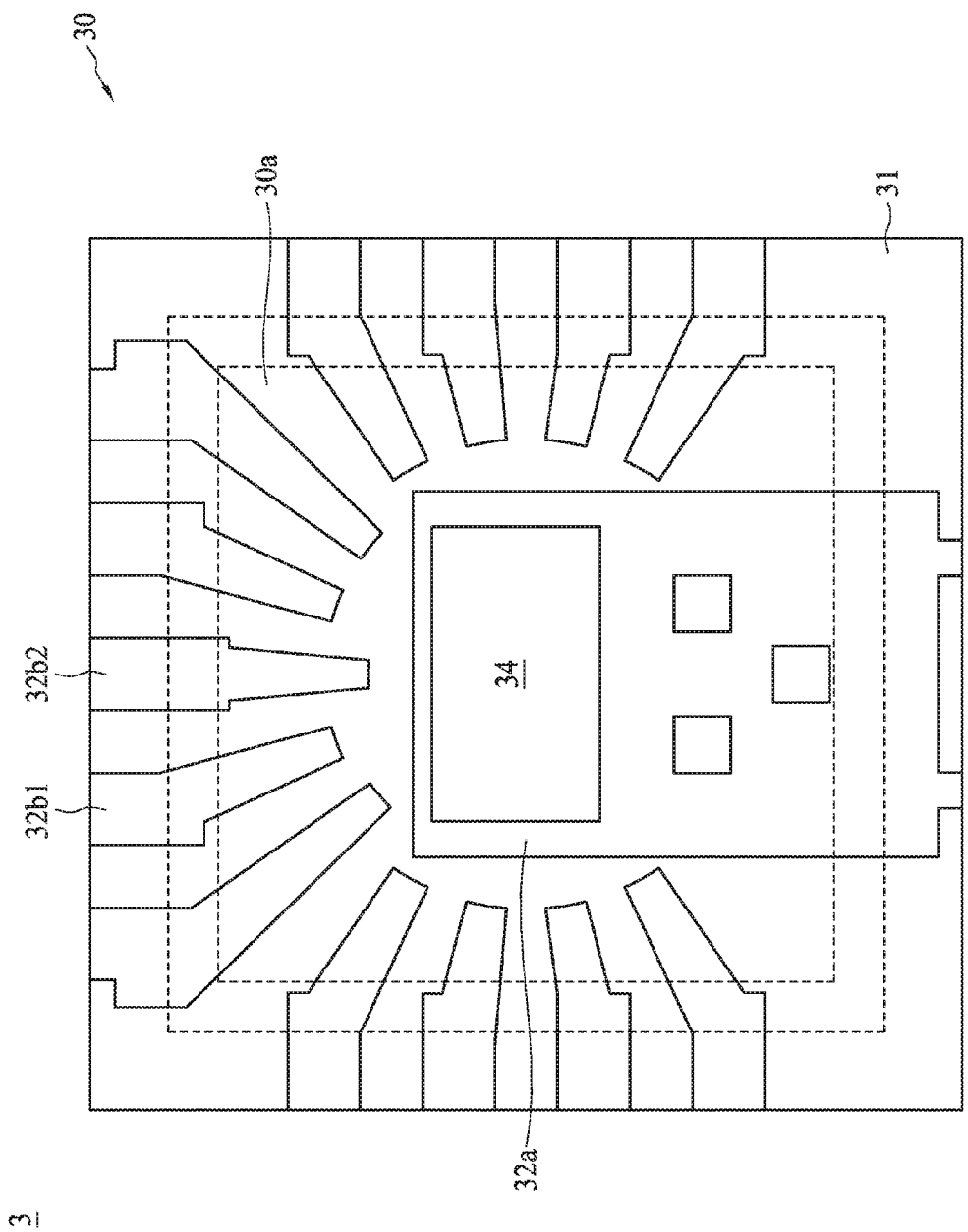
FIG. 3 illustrates a top view of a semiconductor package device in accordance with some embodiments of the present disclosure.

FIG. 3 illustrates a schematic diagram of a semiconductor package device 3 in accordance with some embodiments of the present disclosure. The semiconductor package device 3 is similar to the semiconductor package device 1 shown in FIG. 1C except that lengths of the exposed portion of each lead are not all the same, the carrier 30 has a square cavity 30a in its open top surface extending toward the closed bottom surface, and the die pad 32a is in a square shape. The cavity 30a being square shaped may limit a number and layout of the leads, and bonding of conductive wires between the electronic components and the leads may also be hindered due to different distances between leads and connection pads of the electronic components. In contrast, by using a circular cavity 10a as shown in FIG. 1C, the leads 12b can be made conformal with the edge of the circular die pad 12a, which could increase the number of leads that fit in the semiconductor package device. In addition, as shown in FIG. 3, the distances between each lead and the die pad 32a are not uniform, which may make it difficult to bond conductive wires from the electronic component 34 to the leads. In contrast, as shown in FIG. 1C, since the shape and the size of each lead 12b exposed from the package body 11 are substantially the same, it is simpler to bond the conductive wires 15 from the electronic component 14 to the leads. Therefore, the manufacturing cost and time can be reduced.

Figure 4:
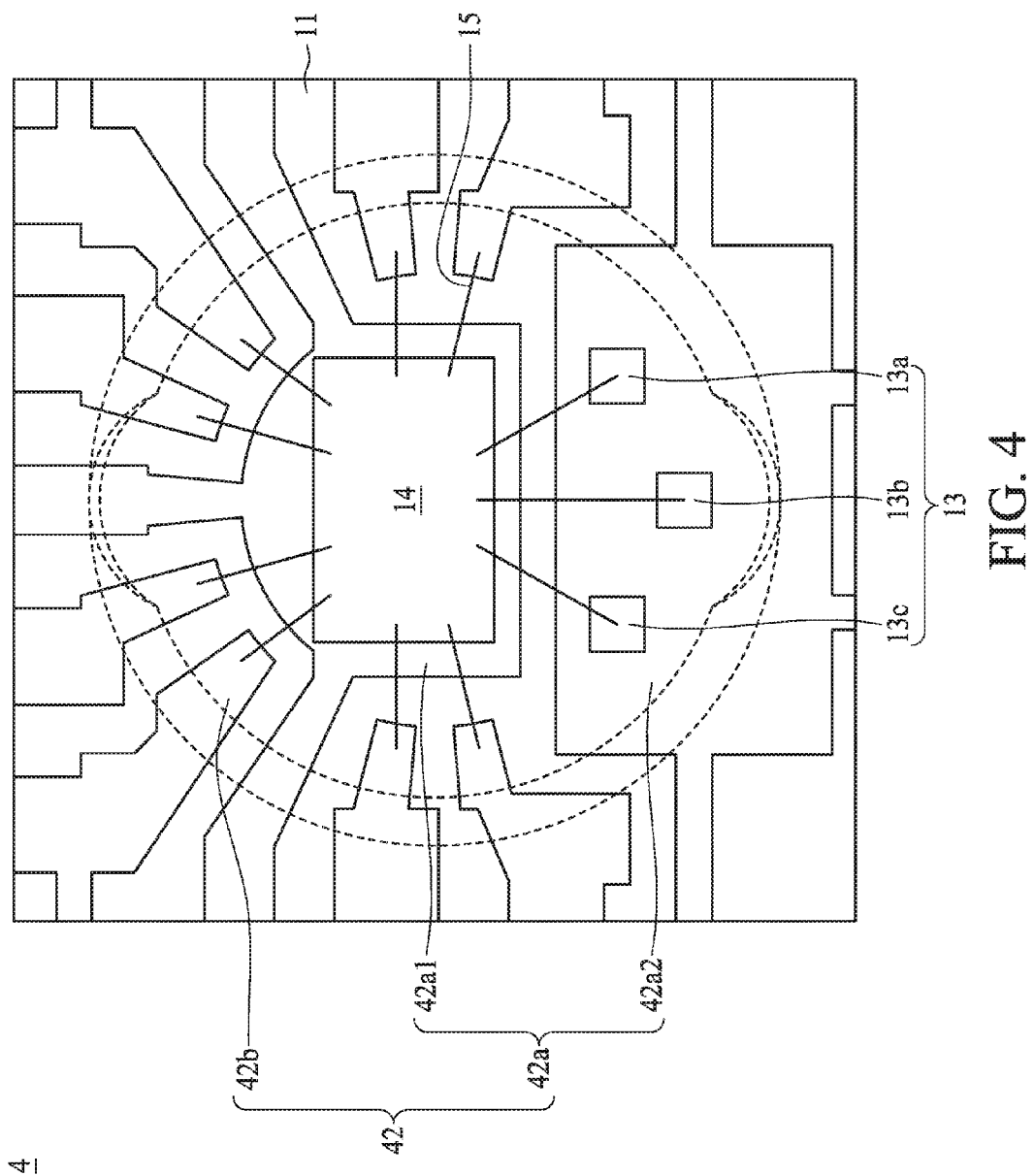
FIG. 4 illustrates a schematic diagram of a semiconductor package device in accordance with some embodiments of the present disclosure.

FIG. 4 illustrates a schematic diagram of a semiconductor package device 4 in accordance with some embodiments of the present disclosure. The semiconductor package device 4 is similar to the semiconductor package device 1 shown in FIG. 1C, except that in FIG. 4, the first area 42a1 of the die pad 42a and the second area 42a2 of the die pad 42a are separated. A gap exists between the first area 42a1 of the die pad 42a and the second area 42a2 of the die pad 42a. A width of the gap may be, for example, in a range from about 0.15 µm to about 0.2 µm.

The LEDs 13a, 13b, 13c are disposed on the second area 42a2 of the die pad 42a. The electronic component 14 is disposed on the first area 42a1 of the die pad 42a. By separating the first area 42a1 and the second area 42a2 of the die pad 42a, the thermal energy produced by the LEDs 13a, 13b, 13c is less likely to adversely affect the electronic component 14.

Figure 5:
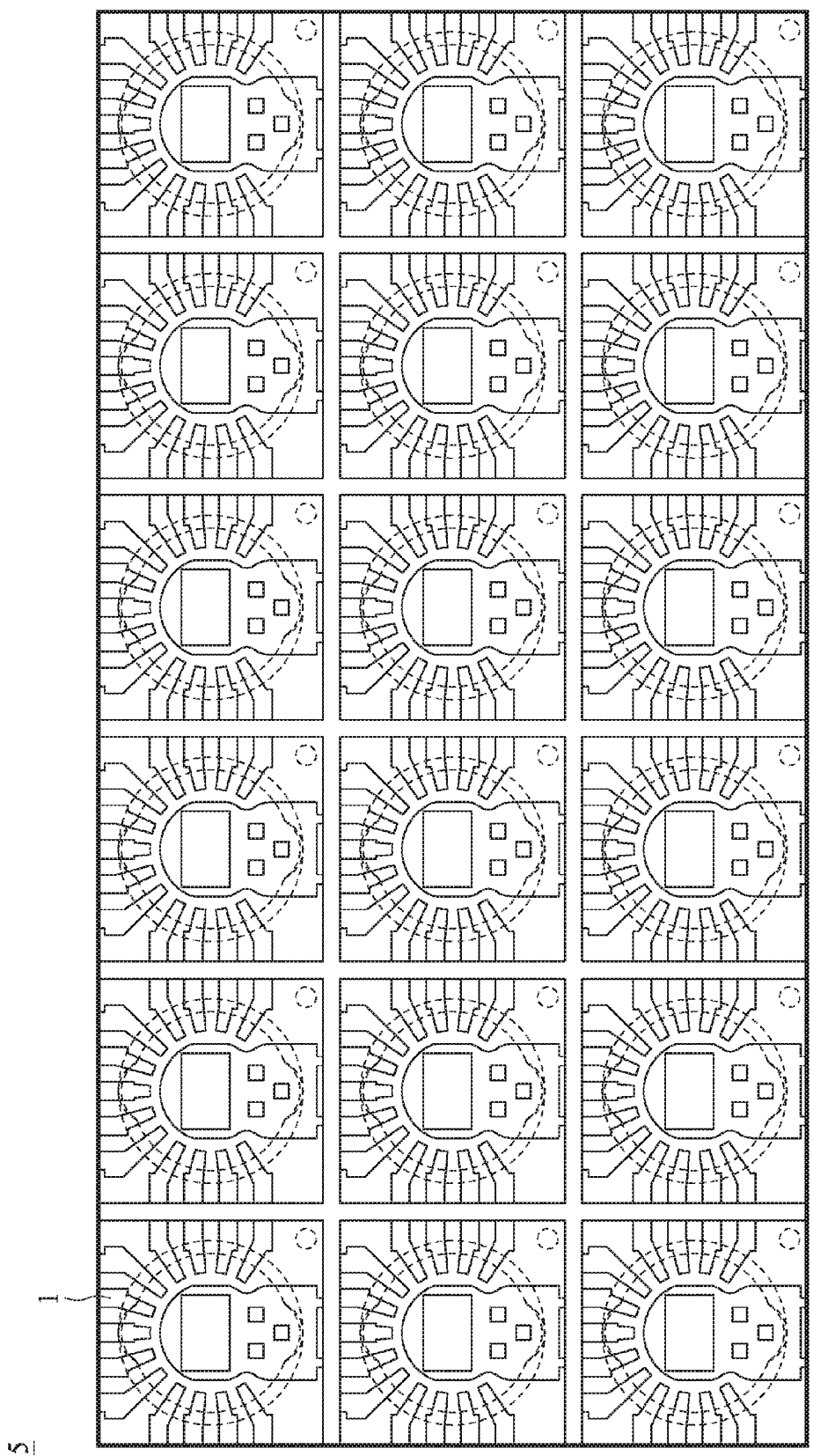
FIG. 5 illustrates a top view of an electronic device in accordance with some embodiments of the present disclosure.

FIG. 5 illustrates a top view of an electronic device 5 in accordance with some embodiments of the present disclosure. In some embodiments, the electronic device 5 is an adjustable LED module. As shown in FIG. 5, the electronic device 5 includes a plurality of the semiconductor package devices 1 shown in FIG. 1A. In some embodiments, the electronic device 5 may include a plurality of the semiconductor package device 2, 3 or 4 shown in FIGS. 2-4 or a combination thereof, including combinations with the semiconductor package devices 1. In some embodiments, the electronic device 5 may include any number of semiconductor package devices.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within µm of lying along a same plane, such as within 40 µm, within 30 µm, within 20 µm, within 10 µm, or within 1 µm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic device, comprising:
   a carrier having an open top surface, a closed bottom surface and sidewalls extending between the closed bottom surface and the open top surface, the carrier having a circular cavity in its open top surface extending toward the closed bottom surface, the carrier including:
   a leadframe including a die pad and a plurality of leads, the leads being physically isolated from the die pad by at least one gap;
   a package body having a sidewall and partially encapsulating the leadframe such that a portion of an upper surface of the die pad and a portion of each of the leads are exposed from the package body, wherein the exposed portions of the leads are arranged radially along the die pad; and
   a plurality of electronic components disposed on the die pad and including a controller and an emitter,
   wherein the sidewall of the package body defines a recess that opens to the circular cavity, and a portion of the die pad extends within the recess, and
   the die pad comprises a central portion on which the controller is disposed and an edge portion on which the emitter is disposed.

2. The electronic device of claim 1, wherein the at least one gap is filled by the package body.

3. The electronic device of claim 1, wherein an edge of the die pad is conformal with an end of each lead.

4. The electronic device of claim 3, wherein distances between the edge of the die pad and the end of each lead are substantially the same.

5. The electronic device of claim 3, wherein the edge of the die pad is in an arc shape.

6. The electronic device of claim 1, wherein a width of the at least one gap is in a range from 0.15 µm to 0.2 µm.

7. The electronic device of claim 1, wherein the central portion and the edge portion are physically separated by a gap in the die pad.

8. The electronic device of claim 1, wherein sidewalls of the circular cavity of the carrier comprise a reflective material.

9. The electronic device of claim 1, wherein another portion of the die pad is covered by the package body.

10. An electronic device comprising:
    a controller,
    an emitter,
    a leadframe including a die pad and a plurality of leads, the leads being physically isolated from the die pad by at least one gap; and
    a package body partially encapsulating the leadframe such that a portion of an upper surface of the die pad and a portion of each of the leads are exposed from the package body, the package body having an open top surface, a closed bottom surface and sidewalls extending between the closed bottom surface and the open top surface, the package body having a circular cavity in its open top surface extending toward the closed bottom surface, the exposed portions of the leads arranged radially along the die pad,
    wherein at least one of the sidewalls of the package body defines a recess that opens to the circular cavity, and a portion of the die pad extends within the recess, and
    the die pad comprises a central portion on which the controller is disposed and an edge portion on which the emitter is disposed.

11. The electronic device of claim 10, wherein the at least one gap is filled by the package body.

12. The electronic device claim 10, wherein an edge of the die pad is conformal with an end of each lead.

13. The electronic device of claim 12, wherein distances between the edge of the die pad and the end of each leads are substantially the same.

14. The electronic device of claim 12, wherein the edge of the die pad is in an arc shape.

15. The electronic device of claim 10, wherein a width of the at least one gap is in a range from 0.15 µm to 0.2 µm.

16. The electronic device of claim 10, wherein sidewalls of the circular cavity of the package body comprise a reflective material.

17. The carrier of claim 10, wherein another portion of the die pad is covered by the package body.

18. An electronic module, comprising:
    a first carrier including a plurality of packages disposed thereon, each package comprising:
    a second carrier having an open top surface, a closed bottom surface and sidewalls extending between the closed bottom surface and the open top surface, the second carrier having a circular cavity in its open top surface extending toward the closed bottom surface, the second carrier including:
    a leadframe including a die pad and a plurality of leads, the leads being physically isolated from the die pad by at least one gap;
    a package body having a sidewall and partially encapsulating the leadframe such that a portion of an upper surface of the die pad and a portion of each of the leads are exposed from the package body, wherein the exposed portions of the leads are arranged radially along the die pad, and wherein the sidewall of the package body defines a recess that opens to the circular cavity, and a portion of the die pad extends within the recess; and
    a plurality of electronic components disposed on the die pad and including a controller and an emitter; and
    a case covering the packages,
    wherein the die pad comprises a central portion on which the controller is disposed and an edge portion on which the emitter is disposed.

19. The electronic module of claim 18, wherein the at least one gap is filled by the package body.

20. The electronic module of claim 18, wherein an edge of the die pad is conformal with an end of each lead.

21. The electronic module of claim 20, wherein distances between the edge of the die pad and the end of each leads are substantially the same.

22. The electronic module of claim 20, wherein the edge of the die pad is in an arc shape.

23. The electronic module of claim 18, wherein a width of the at least one gap is in a range from 0.15 µm to 0.2 µm.

24. The electronic module of claim 18, wherein the central portion and the edge portion are physically separated by a gap in the die pad.

25. The electronic module of claim 18, wherein sidewalls of the circular cavity of the second carrier comprise a reflective material.

26. The electronic module of claim 18, wherein another portion of the die pad is covered by the package body.

\* \* \* \* \*